United States Patent
Menna (10) Patent No.: US 11,038,250 B1
(45) Date of Patent: Jun. 15, 2021

(54) DIRECTIONAL COUPLER ASSEMBLY

(71) Applicant: MiniRF, Inc., Fremont, CA (US)

(72) Inventor: Rudolph J. Menna, Harleysville, PA (US)

(73) Assignee: MiniRF, Inc., Fremont, CA (US)

( * ) Notice: Subject to any disclaimer, the term of this patent is extended or adjusted under 35 U.S.C. 154(b) by 2 days.

(21) Appl. No.: 16/600,915

(22) Filed: Oct. 14, 2019

Related U.S. Application Data (60) Provisional application No. 62/749,246, filed on Oct. 23, 2018.

(51) Int. Cl.
| | |
|---|---|
| *H01P 5/18* | (2006.01) |
| *H03H 7/38* | (2006.01) |
| *H03H 7/46* | (2006.01) |
| *H03H 7/48* | (2006.01) |
| *H04N 21/61* | (2011.01) |

(52) U.S. Cl.
CPC .............. *H01P 5/18* (2013.01); *H03H 7/463* (2013.01); *H03H 7/485* (2013.01); *H04N 21/6168* (2013.01)

(58) Field of Classification Search
CPC ..... H01P 5/16; H01P 5/18; H01P 5/19; H03H 7/38; H03H 7/46
USPC .......................................... 333/112, 118, 119
See application file for complete search history.

(56) References Cited

U.S. PATENT DOCUMENTS

| | | | |
|---|---|---|---|
| 5,058,198 A * | 10/1991 | Rocci ..................... | H04N 7/104 725/149 |
| 6,114,924 A | 9/2000 | Cain et al. ..................... | 333/112 |
| 6,140,887 A | 10/2000 | Zheng ............................ | 333/112 |
| 8,587,387 B2 | 11/2013 | Lee ................................ | 333/109 |
| 2005/0256647 A1 * | 11/2005 | Ellis ..................... | G01N 33/241 702/9 |
| 2009/0256647 A1 | 10/2009 | Bruhns ......................... | 333/109 |
| 2010/0102898 A1 * | 4/2010 | Wren ..................... | H01P 5/184 333/116 |
| 2010/0194489 A1 * | 8/2010 | Kearns ..................... | H01P 5/184 333/116 |
| 2019/0148809 A1 * | 5/2019 | Rijssemus ................ | H04B 3/02 333/109 |

OTHER PUBLICATIONS

Micheal G. Ellis. RF Directional Couplers, 2018, Tripod, (reprint cited in Applicants IDS dated Oct. 16, 2029).*

(Continued)

*Primary Examiner* — Dean O Takaoka
(74) *Attorney, Agent, or Firm* — Christopher P. Maiorana, PC (57) ABSTRACT

An apparatus includes a plurality of ports, a directional coupler transformer and an impedance circuit. The directional coupler transformer may be configured to (i) receive a forward input signal from a first port of the plurality of ports, (ii) generate a coupled signal at a second port of the plurality of ports, (iii) generate a forward output signal and receive a return signal at a third port of the plurality of ports and (iv) generate an internal signal at an internal node. The impedance circuit may be directly connected to the internal node and configured to direct the internal signal to a signal ground to control an isolation between the forward input signal and the return input signal. The isolation is controlled by an impedance of the impedance circuit.

20 Claims, 6 Drawing Sheets

(56) References Cited

OTHER PUBLICATIONS

Netgear, DOCSIS 3.1 Technology Whitepaper, 2016, Netgear Inc., 3 pages.*

Hoaglun, J., "Directional Coupler(Version Two)" (Jan. 16, 2010), pp. 1-6, Retrieved from the Internet May 30, 2018 <URL: http://www.hoaglun.com/blog/2010/1/16/directional-coupler-version-two.html?rq=directional%20Coupler>.

Anderson, J., "Notes on Directional Couplers for HF" (Jan. 1, 2015), pp. 1-20, Retrieved from the Internet May 31, 2018 <URL: http://k6jca.blogspot.com/2015/01/notes-on-directional-couplers-for-hf.html>.

Kim, "Optimum Design of the Power Dividers With Ferrite Toroids for CATV and/or MATV Systems", IEEE Transactions on Consumer Electronics, vol. EC-29, No. 1 (Feb. 1983), pp. 27-47, New York, New York.

Gellis, "rf directional coupler", pp. 1-12, Retrieved from the Internet May 29, 2018 <URL: http://michaelgellis.tripod.com/direct.html>.

Schweber, "Tiny Directional Couplers Meet Demands of Compact RF Applications" (Apr. 9, 2015), pp. 1-7, Retrieved from the Internet May 31, 2018 <URL: https://www.digikey.com/en/articles/techzone/2015/apr/tiny-directional-couplers-meet-demands-of-compact-rf-applications>.

Hall, "The Wideband Directional Coupler ### Theory That Provides Practically Useful Results", Cable Television Engineering (Summer 1990), pp. 764-769, Watford, Herts, United Kingdom.

* cited by examiner

DIRECTIONAL COUPLER ASSEMBLY

This application relates to U.S. Provisional Application No. 62/749,246, filed Oct. 23, 2018, which is hereby incorporated by reference in its entirety.

FIELD OF THE INVENTION

The invention relates to signal couplers generally and, more particularly, to a method and/or apparatus for implementing a directional coupler assembly.

BACKGROUND

A conventional directional coupler is a four-port device used in RF circuits as a means of monitoring and separating signals at input and output ports but at a reduced level for processing by ancillary circuits. Directional couplers inherently provide isolation between sampled input and sampled output signals. The isolation is defined as a ratio of output signal to input signal emanating at the coupled port. The isolation is often expressed in decibels (dB).

Conventional couplers use a 2-hole (balun) ferrite core and bifilar magnet wires. Conventional couplers have an isolation of about 20 to 30 decibels. Currently, in cable television (CATV) systems, Data Over Cable Service Interface Specification (DOCSIS) 3.1 Full Duplex operation is implemented. In order to support higher signal bit rates in both forward and reverse directions for DOCSIS 3.1 Full Duplex operation, much higher isolation (e.g., an isolation of 40 dB or more) is needed.

It would be desirable to implement a directional coupler assembly.

SUMMARY

The invention concerns an apparatus including a plurality of ports, a directional coupler transformer and an impedance circuit. The directional coupler transformer may be configured to (i) receive a forward input signal from a first port of the plurality of ports, (ii) generate a coupled signal at a second port of the plurality of ports, (iii) generate a forward output signal and receive a return input signal at a third port of the plurality of ports and (iv) generate an internal signal at an internal node. The impedance circuit may be directly connected to the internal node and configured to direct the internal signal to a signal ground to control an isolation between the forward input signal and the return input signal. The isolation is controlled by an impedance of the impedance circuit.

BRIEF DESCRIPTION OF THE FIGURES

Embodiments of the invention will be apparent from the following detailed description and the appended claims and drawings.

DETAILED DESCRIPTION OF THE EMBODIMENTS

Embodiments of the present invention include providing a directional coupler assembly that may (i) provide a high isolation, (ii) operate in a full duplex mode, (iii) present common impedances at each port, (iv) be implemented as a three-port assembly, (v) be implemented as a four-port assembly, (vi) be implemented as part of a cable television communication system and/or (vii) be implemented according to a Data Over Cable Service Interface Specification (DOCSIS) 3.1 Full Duplex criteria.

Embodiments of the invention generally provide a directional coupler assembly (or apparatus) that allows signals to simultaneously travel in a forward direction and in a return (or reverse) direction (e.g., full duplex). The simultaneous bidirectional signals may increase data bandwidths, and in turn, increase bit rates in each direction compared with common couplers. The directional coupler may achieve an isolation of greater than 40 dB. In various embodiments, the coupler can support the Data Over Cable Service Interface Specification (DOCSIS) 3.1 Full Duplex criteria at signal frequencies from approximately 5 megahertz (MHz) to approximately 1.2 gigahertz (GHz).

Figure 1:
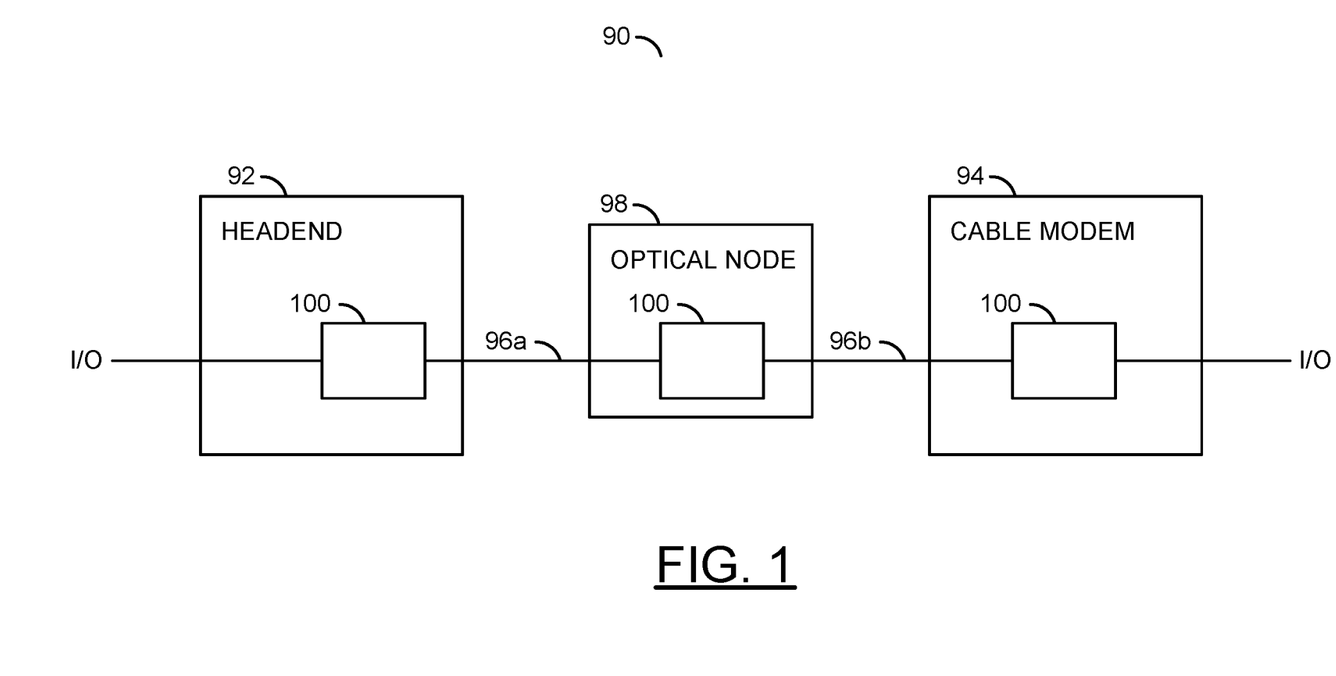
FIG. 1 is a block diagram of a system illustrating a context of the invention according to an embodiment of the invention.

Referring to FIG. 1, a block diagram of a system 90 illustrating a context of the invention is shown according to an embodiment of the invention. The system (or module or circuit or apparatus) 90 may implement a wired telecommunications system. In various embodiments, the system 90 may communicate television signals and/or bidirectional data signals.

The system 90 generally comprises a block (or circuit) 92, one or more blocks (or circuits) 94 (one shown), blocks (or circuits) 96a-96b and/or one or more blocks (or circuits) 98 (one shown). The circuit 92 may comprise one or more blocks (or circuits) 100. Each circuit 94 may comprise another block (or circuit) 100. Each circuit 98 may comprise another block (or circuit) 100. Each of the circuits 92 to 100 may be represented as modules and/or blocks. In various embodiments, the circuits 92 to 100 are implemented in hardware circuitry. However, executable code (e.g., software, firmware, microcode, programming instructions, etc.) embodied in a storage medium may be used to represent the circuits 92 to 100 in operations (e.g., design, modeling, simulation, tape out, etc.) utilizing one or more electronic design tools. The system 90 may comprise other components (not shown). The number, type and/or interconnections between the components of the system 90 may be varied according to the design criteria of a particular implementation.

The circuit 92 may implement a cable headend. The circuit 92 is generally operational to provide bidirectional communications with the circuits 94, the circuits 96a-96b and/or the circuits 98. In various embodiments, the communications may proceed through the circuits 96a-96b and the circuits 100.

Each circuit 94 may implement a cable modem. The circuits 94 are generally operational to provide the bidirectional communications with the circuit 92, the circuits 96a-96b and/or the circuits 98. In various embodiments, the communications may proceed through the circuits 96a-96b and the circuits 100.

The circuits 96a-96b may each implement a bidirectional cable. The circuits 96a-96b are generally operational to convey bidirectional signals between the circuit 92, the circuits 94 and/or the circuits 98. In various embodiments, the circuit 96a may implement one or more coaxial cables and/or one or more optical fiber cables. The circuit 96b may be a coaxial cable. In some embodiments, the circuit 96b may be an optical fiber cable.

Each circuit 98 may implement an optical node and/or an amplifier. Each circuit 98 may be implemented between the circuit 92 and one of the circuits 94. The circuit 98 may be operational to convey bidirectional signals between the circuit 92 and the circuits 94. In an example, the circuit 98 may be configured to amplify and/or prevent a degradation of the bidirectional signals.

In some embodiments, the circuit 98 may be configured as part of a node (e.g., the apparatus 100 may be implemented in the same housing as the node 98). The node 98 may be an active standalone device that has an optical input and RF outputs. In an example, the node 98 may comprise an optical/electrical transducer, RF amplifiers and/or ancillary components (e.g., filters, couplers, response correction circuits, etc.). The node 98 may feed a section of the overall cable network. The node 98 may be powered through a coaxial cable from a remote power supply.

In some embodiments, the circuit 98 may be implemented in an amplifier housing (e.g., the apparatus 100 may be implemented in the same housing as the amplifier 98). For example, the amplifier 98 may be a device implemented in the cable system 90 located after an optical node. In some embodiments, Full Duplex systems may only implement the node 98 between the headend 92 and the cable modem 94. In some embodiments, Full Duplex systems may be extended to systems that comprise both nodes and amplifiers. The apparatus 100 may be implemented in the same housing as other circuitry whether the circuit 98 is implemented as a node or an amplifier.

Each of the circuit 92, the circuit 94 and the circuit 98 are shown comprising the circuit 100. Each of the circuit 92, the circuit 94 and/or the circuit 98 may comprise other components (not shown). The components implemented by the circuit 92, the circuit 94 and/or the circuit 98 may be varied according to the design criteria of a particular implementation.

A signal (e.g., I/O) is shown being transmitted by the cable headend circuit 92. The signal I/O is also shown being transmitted by the cable modem circuit 94. The signal I/O may be a bidirectional signal. In one example, in a forward communication direction, the signal I/O may be received by the cable headend 92 from a data source, and transmitted to a customer via the cable 96a, the optical node 98, the cable 96b and the cable modem 94. In another example, in a reverse direction, the signal I/O may be received by the cable modem 94 from a data source and transmitted via the cable 96b, the optical node 98, the cable 96a and the cable headend 92. The signal I/O may communicate the television and/or data signals.

Each circuit 100 may implement a directional coupler apparatus (or assembly). The apparatuses 100 are generally operational to couple signals flowing from the circuit 92 to the circuit 94, and from the circuit 94 to the circuit 92. Similarly, the apparatuses 100 may be operational to couple signals flowing from the circuit 92 to the circuit 98, from the circuit 98 to the circuit 92, from the circuit 94 to the circuit 98 and/or from the circuit 98 to the circuit 94.

The circuit 100 may comprise a plurality of ports. The signal I/O in the forward direction may be received through an input port of each apparatus 100 and may be directed to an output port enabling the forward signal I/O to be used in other circuitry. A portion of the forward signal I/O received at the input port may be presented at a coupled port, but not an insolation port. The signal I/O in the return direction may be received through the output port of each apparatus 100 and may be presented at the input port. A portion of the return signal I/O received at the output port may be presented at the isolation port, but not the coupled port.

In various embodiments, an input impedance looking into each port of the apparatus 100 (e.g., the input port, the output port, the coupled port and the isolation port) may be a common value used by the cables 96a-96b in the system 90. In one example, the input impedance may be 75 ohms in some systems 90. In another example of the system 90, the input impedance may be 50 ohms. Other impedances may be implemented to meet the design criteria of a particular application.

The apparatus 100 may be configured to provide isolation. The isolation may be a ratio of the energy of an output signal to an energy of an input signal at the coupled port. The apparatus 100 may be configured to achieve high levels of isolation (e.g., 40 dB or more). In an example, an isolation between the forward signal received at the input port and the signal presented from the coupled port may range from greater than approximately 40 dB to approximately 60 dB in accordance with embodiments of the invention. The apparatus 100 may be configured to implement the isolation of approximately 40 dB to approximately 60 dB without affecting the impedance of each port. Achieving the isolation without affecting the impedance of each port may enable the apparatus 100 to be properly used in the system 90 (e.g., 75 ohms at each port to enable the apparatus 100 to be used in a 75 ohm system).

The isolation may be applied to cable television (CATV) systems. CATV systems may have signals traveling in both the forward direction (e.g., to the customer) and reverse direction (e.g., from the customer). With high levels of isolation (and additional circuitry), the same frequency may be used for signals traveling in the forward direction and the reverse direction. In an example, the high levels of isolation may enable a high bit rate.

In some embodiments, the system 90 may have the node 98 and/or one or more amplifiers implemented. The apparatus 100 may be configured to be implemented in the node 98 and/or other circuits 98 configured as amplifiers. For example, the apparatus 100 and processing performed by other components of the node 98 may be configured to keep return and forward signals that use the same frequencies from interfering. Preventing the frequencies from interfering may enable higher bit rates to be implemented for both forward and return signals.

Figure 2:
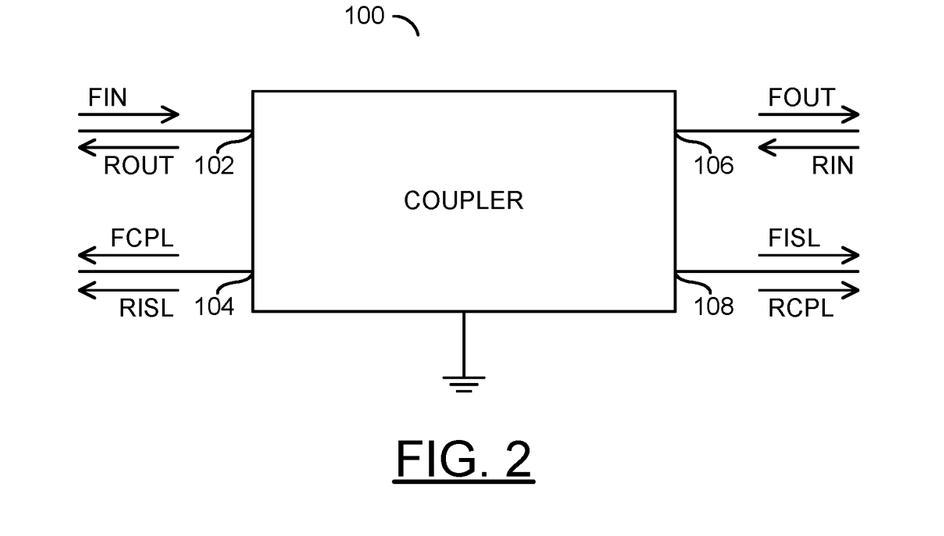
FIG. 2 is a diagram of a directional coupler apparatus in accordance with an embodiment of the invention.

Referring to FIG. 2, a diagram of an example implementation of the directional coupler apparatus 100 is shown in accordance with an embodiment of the invention. The apparatus 100 may represent each apparatus 100 in the system 90. The apparatus 100 generally comprises a port (or node) 102, a port (or node) 104, a port (or node) 106 and a port (or node) 108. The port 102 may implement the input port. The port 104 may implement the coupled port. The port 106 may implement the output port. The port 108 may implement the isolation port.

A signal (e.g., FIN) may be received by the port 102. The signal FIN may be a forward input signal that conveys data to be transferred through the apparatus 100 to the port 106. A signal (e.g., FOUT) may be presented from the port 106. The signal FOUT may be a forward output signal that carries the data received by the apparatus 100 at the port 102. The signal FIN and/or the signal FOUT may represent the signals I/O shown in association with FIG. 1.

A signal (e.g., RIN) may be received by the port 106. The signal RIN may be a return (or reflected) input signal (e.g., flows in the opposite direction as the signal FIN) that conveys data to be transferred through the apparatus 100 to the port 102. A signal (e.g., ROUT) may be presented from the port 102. The signal ROUT may be a return output signal that carries the data received by the apparatus 100 at the port 106. The signal RIN and/or the signal ROUT may represent the signals I/O shown in association with FIG. 1.

A signal (e.g., FCPL) may be presented from the port 104. The signal FCPL may be a forward coupled signal that conveys a portion of the signal FIN received at the port 102. A signal (e.g., FISL) may be presented from the port 108. The signal FISL may be a forward isolation signal that conveys a portion of the signal FIN received at the port 102 and leaked through the apparatus 100.

A signal (e.g., RCPL) may be presented from the port 108. The signal RCPL may be a return coupled signal that conveys a portion of the signal RIN received at the port 106. A signal (e.g., RISL) may be presented from the port 104. The signal RISL may be a return isolation signal that conveys a portion of the signal RIN received at the port 106 and leaked through the apparatus 100.

As illustrated, the apparatus 100 may be implemented as a four-port device. The apparatus 100 may be used in the circuits 92, 94 and 98 to sample the received signals FIN and RIN to generate the signals FCPL, RCPL, FISL and RISL. The apparatus 100 may also be used to separate the signals FIN and RIN going across the bus 96a-96b in opposite directions. In an example, separating the signals FIN and RIN may allow additional processing outside of the coupler 100 to enhance the forward and reverse signals.

The signal FIN may be sent to the coupled port 104 at attenuated levels. In an example, the attenuated levels may be typically at −6 dB, −8 dB, −10 dB, etc. The signal RIN may be directed to the port 108 at the same attenuation levels as used in the forward direction. Therefore, the forward signal FIN and the return signal RIN may be electrically separated from each other while simultaneously passing through the apparatus 100. Alternatively, any reflected and/or leaked signals may be absorbed with a termination at the port 108. Absorbing the reflected and/or leaked signals may prevent reflected/leaked signals from interfering with the forward signal FIN and/or the reverse signal RIN.

In an example where the system 90 is an N-ohm system, each of the ports 102 to 108 may be configured to be terminated in the same impedance. In an example embodiment, each of the ports 102 to 108 may be configured to be terminated into a 75-ohm impedance. In other embodiments, each of the ports 102 to 108 may be configured to be terminated into a 50-ohm impedance. Other impedances may be implemented to meet the design criteria of a particular application.

Figure 3:
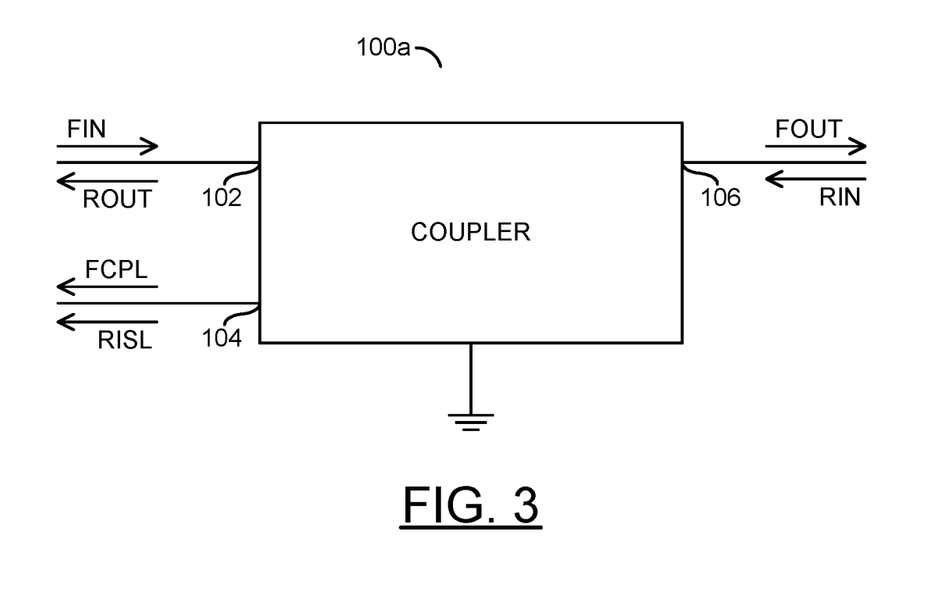
FIG. 3 is a diagram of another apparatus in accordance with an embodiment of the invention.

Referring to FIG. 3, a diagram of an example implementation of an apparatus 100a is shown in accordance with an embodiment of the invention. The apparatus 100a may implement a three-port directional coupler assembly. In an example embodiment, the apparatus 100a may have a similar implementation as the four-port coupler 100 shown in association with FIG. 2, but may be implemented with the port 108 removed and replaced by an internal termination. In an example, the internal termination may be a resistance selected to have an optimized value to provide the best isolation. The apparatus 100 may comprise the port 102, the port 104 and the port 106. The port 102 is shown communicating the signal FIN and the signal ROUT. The port 104 is shown communicating the signal FCPL and the signal RISL. The port 106 is shown communicating the signal FOUT and the signal RIN.

Figure 4:
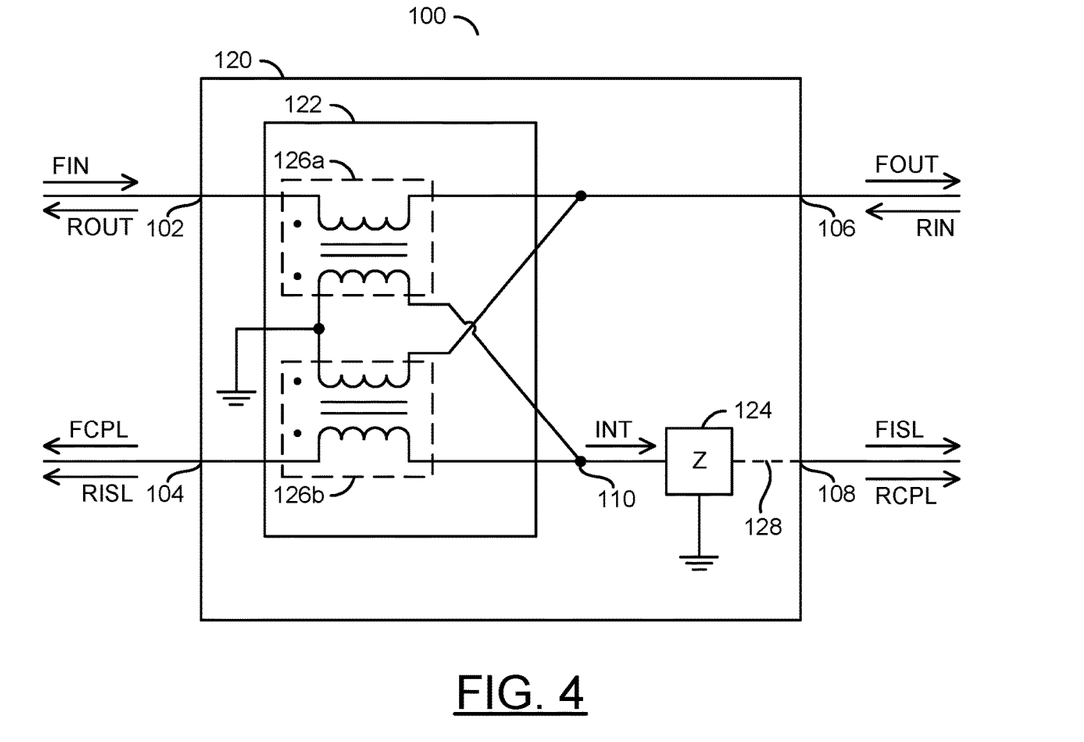
FIG. 4 is a detailed diagram of the directional coupler in accordance with an embodiment of the invention.

Referring to FIG. 4, a detailed diagram of an example implementation of the apparatus 100 is shown in accordance with an embodiment of the invention. The apparatus 100 generally comprises the ports 102 to 108, a node (or connection) 110, a housing (or structure) 120, a block (or circuit) 122 and/or a block (or circuit) 124. The circuits 122 to 124 may be represented as modules and/or blocks. Generally, the circuits 122 to 124 may be implemented in the four-port coupler embodiment 100 and the three-port coupler embodiment 100a. In various embodiments, the circuits 122 to 124 are implemented in hardware circuitry. However, executable code (e.g., software, firmware, microcode, programming instructions, etc.) embodied in a storage medium may be used to represent the circuits 122 to 124 in operations (e.g., design, modeling, simulation, tape out, etc.) utilizing one or more electronic design tools. Other components may be implemented (not shown). The number, type and/or arrangement of the components of the apparatus 100 may be varied according to the design criteria of a particular implementation.

The signals FIN may be received by the circuit 122. The circuit 122 may receive the signal RIN. The signal ROUT may be generated by the circuit 122. The signal FOUT may be generated by the circuit 122. The signal FCPL may be generated by the circuit 122. The circuit 122 may generate the signal RISL. The circuit 124 may generate the signal FISL. The signal RCPL may be generated by the circuit 124. A signal (e.g., INT) may be generated by the circuit 122 and received by the circuit 124. The signal INT may implement an internal signal that conveys a portion of the signal FIN and a portion of the signal RIN. Other signals may be implemented (not shown). The number, type and/or function of the signals implemented by the apparatus 100 may be varied according to the design criteria of a particular implementation.

The node 110 may implement a hardwired internal node. The node 110 may connect the circuit 122 to the circuit 124. The signal INT may flow through the node 110. The node 110 may be disposed inside the housing 120.

The housing 120 may implement a structure configured to hold (or contain, or secure, or provide structure for) the ports 102 to 108, the node 110 and the circuits 122 to 124. The housing 120 may provide an environmental shield for the ports 102 to 108, the node 110 and the circuits 122 to 124. In various embodiments, the housing 120 may be fabricated of a conductive material. The conductive material may provide electromagnetic shielding for the circuitry disposed therein. The conductive material of the housing 120 may also provide a signal ground for the signals FIN, ROUT, FCPL, RISL, FOUT, RIN, FISL and RCPL.

The housing 120 may enable the apparatus 100 to be implemented within the node (or amplifier) 98 between the headend circuit 92 and the cable modem 94. Generally, the apparatus 100 may be implemented within the housing 120 along with additional circuitry (not shown). The additional circuitry may be configured to process the signal FCPL and/or the signal RCPL. The processing performed by the additional circuitry within the housing 120 may comprise enhancing the performance (e.g., increasing the bit rate) of forward signals and/or directing return signals to a laser configured to send the return signals to the headend 92, etc.

The circuit 122 may implement a dual-winding directional coupler transformer. The circuit 122 may be disposed inside the housing 120. The circuit 122 may comprise a first winding 126a and a second winding 126b. A primary side of the first winding 126a may be directly connected between the ports 102 and 106. A secondary side of the first winding 126a may be directly connected between a signal ground and the node 110. A primary side of the second winding 126b may be directly connected between the port 104 and the node 110. A secondary side of the second winding 126b may be directly connected between the signal ground and the node 106.

The circuit 124 may implement an impedance circuit. The circuit 124 may be disposed inside the housing 120. The circuit 124 is generally operational to provide an impedance between the node 110 and the signal ground. In some embodiments (e.g., the four-port embodiment shown in association with FIG. 2), the circuit 124 may be configured to provide an impedance between the node 110 and the port 108. The circuit 124 may be configured to increase or decrease an impedance seen at the port 108 by a value that increases the isolation of the apparatus 100 significantly. In an example, the impedance of the impedance circuit 124 may be greater than or less than an impedance at the port 102, the port 104, the port 106 and/or the port 108. In one example, the port 102, the port 104, the port 106 and/or the port 108 may each be 75-ohms. The circuit 124 may be configured to implement the isolation without affecting the impedance of each port. The circuit 124 may direct the internal signal INT to ground to control an isolation between the forward input signal FIN and the return input signal RIN. The amount of isolation may be controlled by the impedance value of the impedance circuit 124.

A dotted line 128 is shown between the circuit 124 and the port 108. The dotted line 128 may represent an optional connection between the circuit 124 and the port 108. In an example where the apparatus 100 is a four-port coupler as shown in association with FIG. 2, the connection 128 may be implemented. In an example where the apparatus 100 is a three-port coupler as shown in association with FIG. 3, the connection 128 and the port 108 may not be implemented. For example, in the three-port coupler 100a, the node 110 may be terminated inside the housing 120. In the three-port apparatus 100a, the change in impedance may take the form of a resistor or a complex impedance (e.g., a combination of a resistor and a capacitor or a combination of a resistor and inductor) inside the housing 120.

Isolation may be increased by selecting the impedance value of the circuit 124. In one example, the circuit 122 may implement a weakly-coupled power divider. For a weakly-coupled power divider, the impedance value to select for the circuit 124 may be determined by an equation (e.g., EQ1):

$$RL = (2-r^2)/(2-3r^2) \quad \text{(EQ1)}$$

In the equation EQ1, the value RL may be an isolation resistance that has a desired value. In an example, the desired value may be an optimum resistance value for increasing the isolation (e.g., to provide a high isolation such as an isolation range of approximately −40 dB to −60 dB in the full duplex band). The equation EQ1 may be an approximation based on reasonable assumptions for an equation derived from admittance matrices for a weakly-coupled power divider. A value r1 may be a ratio of a primary inductance to a secondary inductance in the first (e.g., top) winding 126a of the transformer circuit 122 and a value r2 may be a ratio of a primary inductance to a secondary inductance in the second (e.g., bottom) winding 126b of the transformer circuit 122. In an example, the reasonable assumption for the equation EQ1 may be that the ratio r1 and the ratio r2 may be equal (e.g., which is common in many couplers). The ratio r of the equation EQ1 may represent the equal value of the ratio r1 and the ratio r2. In another example, the reasonable assumption for the equation EQ1 may be that the ratio r is sufficiently smaller than 1. The equation EQ1 and/or the equation derived from admittance matrices for the weakly-coupled power divider may be described in "Optimum Design of the Power Dividers with Ferrite Toroids for CATV and/or MATV Systems" by Kim et al. (IEEE Transactions on Consumer Electronics, Vol. CE-29, No 1, February 1983), appropriate portions of which are hereby incorporated by reference.

Figure 5:
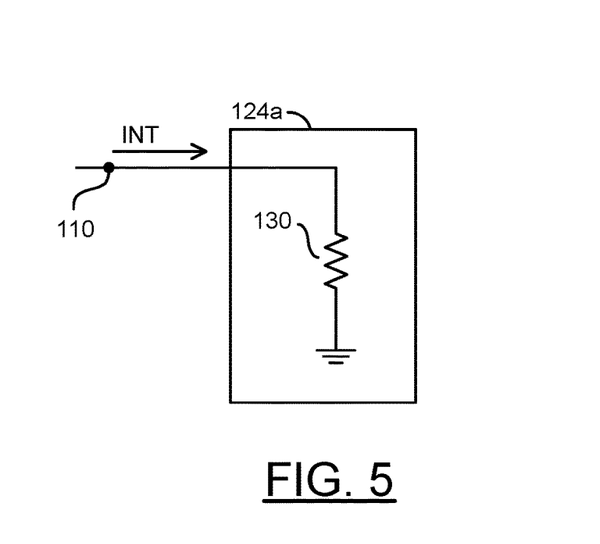
FIG. 5 is a diagram of an impedance circuit of the directional coupler apparatus in accordance with an embodiment of the invention.

Referring to FIG. 5, a diagram of an example implementation of a circuit 124a is shown in accordance with an embodiment of the invention. The circuit 124a may be an example representing the circuit 124. The circuit 124a generally comprises a resistor (or impedance) 130. The resistor 130 may be connected to direct the signal INT to the signal ground. The resistance 130 may be selected to a desired value (e.g., an optimal value for best isolation). In example, a value of the resistor 130 may be determined by the value RL in the equation EQ1. In an embodiment where the circuit 124a is implemented in a three-port version of the coupler 100a, there may be no connection between the circuit 124a and the port 108 (e.g., an infinite impedance as the port 108 may not be implemented in the three-port version of the coupler 100a). In a 75-ohm type system 90, the resistor 130 may have a value in a range of 50 ohms and 100 ohms. Other resistance values may be implemented to meet the design criteria of a particular application.

Figure 6:
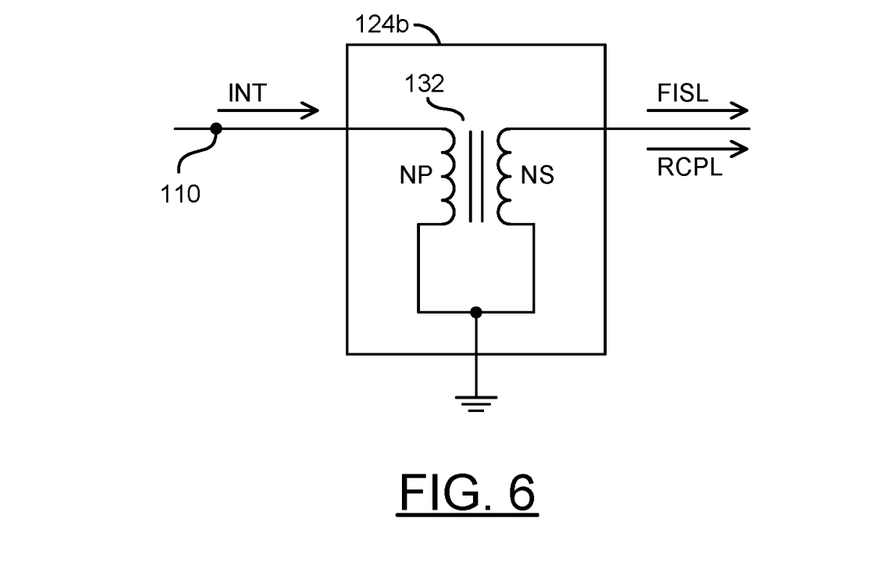
FIG. 6 is a diagram of another impedance circuit accordance with an embodiment of the invention.

Referring to FIG. 6, a diagram of an example implementation of a circuit 124b is shown in accordance with an embodiment of the invention. The circuit 124b may be an example representing the circuit 124. The circuit 124b generally comprises an impedance transformer 132. The higher impedance at the port 108 may be created using the impedance transformer 132 inside the housing 120 as the circuit 124 between the node 110 and the port 108.

A primary winding of the impedance transformer 132 may be connected between the signal ground and the node 110 to receive the signal INT. A secondary winding of the impedance transformer 132 may be connected between the signal ground and the port 108 to present the signals FISL and RCPL. In various embodiments, a number of turns in the primary windings of the impedance transformer 132 may be greater than a number of turns in the secondary winding of the impedance transformer 132 (e.g., a winding ratio of primary-to-secondary turns may be greater than one-to-one). Other winding ratios may be implemented to meet the design criteria of a particular application.

Figure 7:
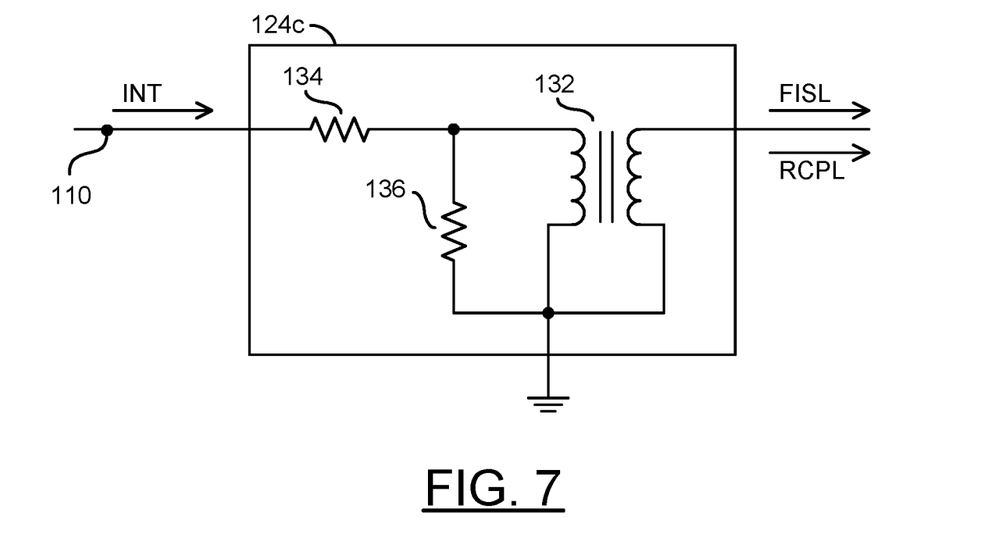
FIG. 7 is a diagram of still another impedance circuit in accordance with an embodiment of the invention.

Referring to FIG. 7, a diagram of an example implementation of a circuit 124c is shown in accordance with an embodiment of the invention. The circuit 124c may be an example representing the circuit 124 and/or the circuit 124b.

The circuit 124c generally comprises the impedance transformer 132, a resistor (or impedance) 134 and a resistor (or impedance) 136. The impedance at the port 108 may be created using the circuit 124c inside the housing 120 between the node 110 and the port 108. The additional resistors 134 and 136 may be used internally to adjust the impedance. Adjusting the impedance may enable implementing a desired (e.g., optimized) amount of the isolation.

The resistor 134 may be connected in series between the node 110 and the transformer 132. The signal INT may be received by the resistor 134. The other end of the resistor 134 may be connected to the primary winding of the impedance transformer 132. The resistor 136 may be connected in parallel to the primary winding of the impedance transformer 132. The secondary winding of the impedance transformer 132 may present the signals FISL and RCPL.

Figure 8:
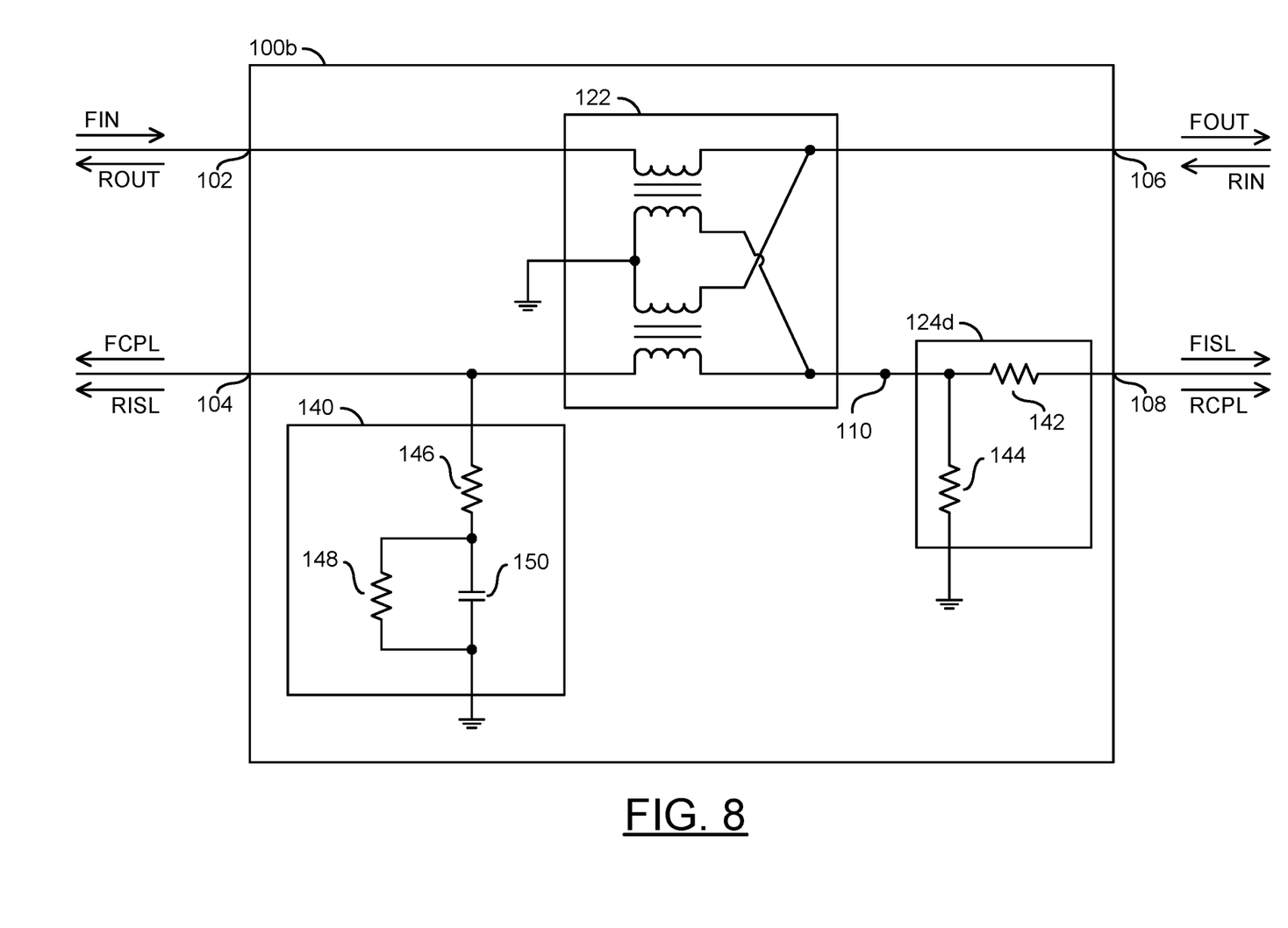
FIG. 8 is a diagram of still another apparatus accordance with an embodiment of the invention.

Referring to FIG. 8, a diagram of an example implementation of an apparatus 100b is shown in accordance with an embodiment of the invention. The apparatus 100b may be a variation of the apparatus 100 and/or the apparatus 100a. The apparatus 100b may be configured to increase the isolation in both directions simultaneously. The apparatus 100b may be implemented without an internal impedance transformer (e.g., the impedance transformer 132).

The apparatus 100b generally comprises the transformer 122, the impedance circuit 124d and a block (or circuit) 140. In various embodiments, the circuits 122 to 140 are implemented in hardware circuitry. However, executable code (e.g., software, firmware, microcode, programming instructions, etc.) embodied in a storage medium may be used to represent the circuits 122 to 140 in operations (e.g., design, modeling, simulation, tape out, etc.) utilizing one or more electronic design tools. The apparatus 100b may comprise other components (not shown). The number, type and/or arrangement of the components of the apparatus 100b may be varied according to the design criteria of a particular implementation.

The signals FIN may be received by the circuit 122. The circuit 122 may receive the signal RIN. The signal ROUT may be generated by the circuit 122. The signal FOUT may be generated by the circuit 122. The signal FCPL may be generated by the circuit 122. The circuit 122 may generate the signal RISL. The circuit 124d may generate the signal FISL. The signal RCPL may be generated by the circuit 124d. Other signals may be implemented. The number, type and/or function of the signals of the apparatus 100b may be varied according to the design criteria of a particular implementation.

The circuit 124d may be an example representing the circuit 124, the circuit 124b and/or the circuit 124c. The circuit 124d generally comprises a resistor (or impedance) 142 and a resistor (or impedance) 144. The impedance at the port 108 may be created using the circuit 124d inside the housing 120 between the node 110 and the port 108. The resistors 142 and 144 may be used internally to adjust the impedance allowing optimization of the isolation.

The circuit 140 may implement a frequency-dependent impedance. The circuit 140 may be connected between the port 104 and the signal ground. In various embodiments, the circuit 140 may implement a low-pass RC filter circuit. The frequency-dependent impedance may adjust the isolation at higher frequencies by directing more of the higher frequency energy to the signal ground. The adjustment of the isolation based on frequency may generally avoid the signal loss due to the impedance transformer 132, may simplify implementation and/or may occupy a smaller space (e.g., enable implementing a smaller version of the housing 120) than implementations having the impedance transformer 132.

The circuit 140 generally comprises a resistor (or impedance) 146, a resistor (or impedance) 148 and a capacitor (or impedance) 150. The resistor 148 may be connected in parallel to the capacitor 150. The resistor 148/capacitor 150 circuit may be connected between the signal ground and the resistor 146. The other end of the resistor 146 may be connected to the port 104.

At low frequencies, the impedance through the capacitor 150 may be large compared with the impedance (resistance) of the resistor 148. In such situations, the impedance of the circuit 140 may be essentially a sum of the resistance values of the resistors 146 and 148. As the frequency increases, the impedance of the capacitor 150 may decrease. The impedance of the capacitor 150 may decrease to a point of matching the resistance of the resistor 148. At high frequencies, the impedance through the capacitor 150 may become small relative to the resistor 148. At sufficiently high frequencies, the impedance of the circuit 140 may be dominated by just the resistor 146. Since the impedance of the series resistors 146 and 148 is greater than the impedance of the resistor 148 alone, the circuit 140 may allow more low-frequency energy in the signals FCPL to pass out the port 104 than the high-frequency energy.

In an example embodiment for a 75-ohm apparatus 100b (e.g., 75-ohm impedance from each port 102 to 108 to the signal ground), the resistor 142 may be implemented as a 15-ohm resistor. The resistor 144 may be implemented as a 5,000-ohm resistor. The resistor 146 may be implemented as a 400-ohm resistor. The resistor 148 may be implemented as a 50-ohm resistor. The capacitor 150 may be implemented as a 3-picofarad capacitor. Other resistance values and capacitance values may be implemented to meet the design criteria of a particular application.

Figure 9:
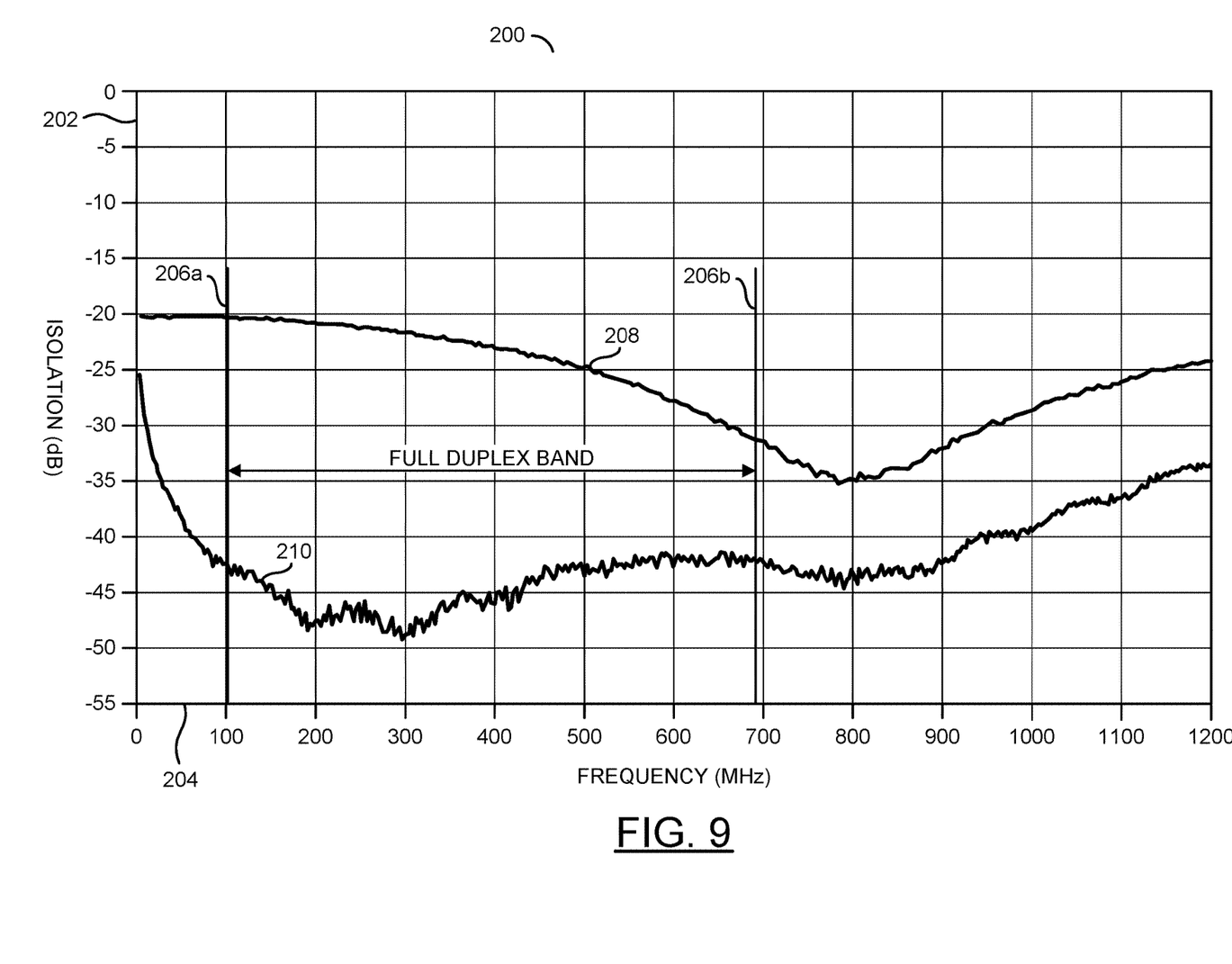
FIG. 9 is a diagram of a graph illustrating the isolation of the apparatus.

Referring to FIG. 9, a diagram of a graph illustrating the isolation of the apparatus 100 is shown. A graph 200 is shown. The graph 200 may comprise a Y axis 202 and a X axis 204. The Y axis may indicate an isolation measurement in decibels (dB). The X axis may indicate a frequency measurement in megahertz (MHz). The Y axis 202 is shown having a range from −55 dB to 0 dB. The X axis 204 is shown having a range of 0 MHz to 1200 MHz.

Vertical lines 206a-206b are shown on the graph 200. The vertical line 206a may correspond with approximately a frequency of 100 MHz. The vertical line 206b may correspond with approximately a frequency of 700 MHz. The vertical lines 206a-206b may correspond to a frequency range that represents the full duplex band. In an example, operation over the full duplex band 206a-206b may be the region of interest for (DOCSIS) 3.1 Full Duplex. Generally, a greater amount of isolation (e.g., −40 dB or more) may be preferred in the full duplex band 206a-206b.

A plot line 208 is shown. The plot line 208 may represent the isolation response of a standard 8 dB coupler. The standard coupler plot 208 may have an isolation of approximately −20 dB at 100 MHz (e.g., the beginning of the full duplex band 206a). In the full duplex band 206a-206b, the isolation of the standard coupler plot 208 may generally range from −20 dB to approximately −30 dB (e.g., a gradual change). At the end of the full duplex band 206b at approximately 700 MHz, the standard coupler plot 208 may be at approximately −32 dB. After the end of the full duplex band 206b, the standard coupler plot 208 may reach a highest isolation at approximately −35 dB at 800 MHz. The standard coupler plot 208 may change towards approximately −25 dB at 1200 MHz. Generally, the standard coupler plot 208 may have a range of approximately −20 dB to −35 dB.

A plot line 210 is shown. The plot line 210 may represent the isolation response of the apparatus 100 (e.g., a high isolation coupler). The isolation plot 210 of the apparatus 100 may have an isolation of approximately −20 dB at 0 MHz and rapidly change to approximately −43 dB at 100 MHz (e.g., the beginning of the full duplex band 206a). In the full duplex band 206a-206b, the isolation plot 210 of the apparatus 100 may generally range from −43 dB to approximately −50 dB (e.g., approximately −50 dB at 300 MHz and then towards −43 dB at the end of the full duplex band 206b at approximately 700 MHz). After the end of the full duplex band 206b, the isolation plot 210 of the apparatus 100 may remain at approximately −45 dB at approximately 800 MHz. The isolation plot 210 of the apparatus 100 may change towards approximately −35 dB at 1200 MHz. Generally, the isolation plot 210 of the apparatus 100 may have a range of approximately −40 dB to −50 dB across the full duplex band 206a-206b.

Compared to the plot 208, the isolation plot 210 of the apparatus 100 may have more isolation at all comparable frequencies. Within the full duplex band 206a-206b, the isolation plot 210 of the apparatus 100 may be 10 dB to 20 dB higher. The apparatus 100 may have better performance than the standard coupler. The apparatus 100 may have approximately −40 dB of isolation or more within the full duplex band 206a-206b.

The functions and structures illustrated in the diagrams of FIGS. 1 to 9 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A method for directional coupling, comprising the steps of:
   receiving a forward input signal at a first port;
   generating a coupled signal at a second port;
   generating a forward output signal at a third port;
   receiving a return input signal at said third port;
   generating an internal signal at an internal node using a directional coupler transformer; and
   directing said internal signal to a signal ground through an impedance using an impedance circuit directly connected to said internal node to control an isolation between said forward input signal and said return input signal, wherein (i) said isolation is controlled by said impedance of said impedance circuit and (ii) said impedance of said impedance circuit is greater than or less than an input impedance at each of said first port, said second port and said third port.

2. An apparatus comprising:
   a plurality of ports;
   a directional coupler transformer configured to (i) receive a forward input signal from a first port of said plurality of ports, (ii) generate a coupled signal at a second port of said plurality of ports, (iii) generate a forward output signal and receive a return input signal at a third port of said plurality of ports and (iv) generate an internal signal at an internal node; and
   an impedance circuit directly connected to said internal node and configured to direct said internal signal to a signal ground to control an isolation between said forward input signal and said return input signal, wherein (i) said isolation is controlled by an impedance of said impedance circuit and (ii) said impedance of said impedance circuit is greater than or less than an input impedance of said apparatus at each of said first port, said second port and said third port.

3. The apparatus according to claim 2, wherein said input impedance at each of said first port, said second port and said third port is 75 ohms.

4. The apparatus according to claim 2, wherein said impedance circuit comprises a resistor directly connected between said internal node and said signal ground.

5. The apparatus according to claim 4, wherein (i) said resistor is selected according to an equation $(2-r^2)/(2-3r^2)$, where r is an equal value of ratio of a primary inductance to a secondary inductance for first windings and second windings of said directional coupler transformer and (ii) said resistor is selected to enable high isolation.

6. The apparatus according to claim 2, wherein said isolation between said forward input signal and said return input signal is between approximately 40 decibels and approximately 60 decibels.

7. The apparatus according to claim 2, wherein said isolation between said forward input signal and said return input signal is compliant with Data Over Cable Service Interface Specification 3.1 Full Duplex.

8. The apparatus according to claim 2, further comprising a fourth port of said plurality of ports and directly connected to said impedance circuit, wherein said impedance circuit is further configured to generate an isolation signal at said fourth port.

9. The apparatus according to claim 8, wherein said impedance circuit comprises a transformer connected to said internal node, said fourth port and said signal ground.

10. The apparatus according to claim 9, wherein a primary winding of said transformer is directly connected between said internal node and said signal ground.

11. The apparatus according to claim 9, wherein a secondary winding of said transformer is directly connected between said fourth port and said signal ground.

12. The apparatus according to claim 9, wherein a first number of turns in a primary winding of said transformer is greater than a second number of turns in a secondary winding of said transformer.

13. The apparatus according to claim 9, further comprising a resistor in series between said transformer and said internal node.

14. The apparatus according to claim 9, further comprising a resistor in parallel to a winding of said transformer.

15. The apparatus according to claim 2, further comprising a second impedance circuit directly connected between said second port and said signal ground.

16. The apparatus according to claim 15, wherein said second impedance circuit comprises a frequency-dependent impedance.

17. The apparatus according to claim 15, wherein said second impedance circuit comprises a low-pass filter circuit.

18. The apparatus according to claim 2, wherein (i) said directional coupler transformer and said impedance circuit are disposed within a housing and (ii) said plurality of ports are on said housing.

19. An apparatus comprising:
a plurality of ports;
a directional coupler transformer configured to (i) receive a forward input signal from a first port of said plurality of ports, (ii) generate a coupled signal at a second port of said plurality of ports, (iii) generate a forward output signal and receive a return input signal at a third port of said plurality of ports and (iv) generate an internal signal at an internal node;
an impedance circuit directly connected to said internal node and configured to direct said internal signal to a signal ground to control an isolation between said forward input signal and said return input signal; and
a second impedance circuit directly connected between said second port and said signal ground, wherein (i) said isolation is controlled by an impedance of said impedance circuit and (ii) said second impedance circuit comprises a low-pass filter circuit.

20. An apparatus comprising:
a plurality of ports;
a directional coupler transformer configured to (i) receive a forward input signal from a first port of said plurality of ports, (ii) generate a coupled signal at a second port of said plurality of ports, (iii) generate a forward output signal and receive a return input signal at a third port of said plurality of ports and (iv) generate an internal signal at an internal node; and
an impedance circuit directly connected to said internal node and configured to (i) direct said internal signal to a signal ground to control an isolation between said forward input signal and said return input signal and (ii) generate an isolation signal at a fourth port of said plurality of ports directly connected to said impedance circuit, wherein (a) said isolation is controlled by an impedance of said impedance circuit and (b) said impedance circuit comprises a transformer connected to said internal node, said fourth port and said signal ground.

* * * * *